United States Patent [19]

Adelman

[11] 4,038,042

[45] July 26, 1977

[54] ELECTROPLATING OF POLYPROPYLENE COMPOSITIONS

[75] Inventor: Robert L. Adelman, Wilmington, Del.

[73] Assignee: E. I. Du Pont de Nemours and Company, Wilmington, Del.

[21] Appl. No.: 707,634

[22] Filed: July 22, 1976

Related U.S. Application Data

[60] Division of Ser. No. 641,949, Dec. 18, 1975, Pat. No. 4,002,595, which is a continuation-in-part of Ser. No. 428,725, Dec. 27, 1973, abandoned.

[51] Int. Cl.$^2$ ............................ B23P 3/00; C25D 5/34
[52] U.S. Cl. ................................. 428/625; 204/32 R; 428/626; 264/129

[58] Field of Search .................... 204/32 R, 29, 30; 29/195 P

[56] References Cited

PUBLICATIONS

F. A. Lowenheim, Metal Coating of Plastics, pp. 54–77, (1970).

*Primary Examiner*—G. L. Kaplan

[57] ABSTRACT

Certain polyolefin-based compositions are readily electroplatable and possess particularly desirable combinations of characteristics. These are blends of specified proportions and types of polypropylene, low polarity rubber, highly conductive carbon black, polyethylene and optional mineral additives. The compositions permit direct electroplating to give highly decorative, adherent, plated surfaces.

13 Claims, No Drawings

ELECTROPLATING OF POLYPROPYLENE COMPOSITIONS

CROSS REFERENCE TO RELATED APPLICATION

This is a divisional of application Ser. No. 641,949 filed Dec. 18, 1975, now U.S. Pat. No. 4,002,595, which in turn was a continuation-in-part of application Ser. No. 428,725, filed Dec. 27, 1973, now abandoned.

BACKGROUND OF THE INVENTION

This invention relates to plastic compositions which are directly electroplatable and to the production of electroplated compositions. More particularly it relates to specific compositions based on hydrocarbon polymers which are capable of being directly electroplated after a simplified sequence of steps, to give highly decorative, well-adhering metal coatings.

The electroplating process for placing metal on plastics has many advantages over other methods including vacuum evaporation and chemical vapor deposition, such as the ability to place heavier metal coatings with good adhesion and good durability.

Conventional preelectroplating processes for plastics have been described often in the literature. A recent outline of such processes is given, for example, in an article by G. K. Schwarz, Industrial Finishing and Surface Coatings (London) 23, 277, pages 12, 14, 26 (1971). In principle, in order to electroplate metals on plastics an electrically conductive surface is required, and this is normally obtained by starting with an electroless plating process. This involves (1) a conditioning step wherein the surface of the plastic is etched or roughened in an acid bath to promote the formation of a strong bond, (2) a sensitizing step wherein the conditioned surface of the plastic is made potentially catalytic to electroless plating by absorbing precious metal salts such as gold, silver, or palladium chloride, (3) an accelerating step wherein the plastic is immersed in an accelerator solution consisting of a reducing agent such as tin or titanium salts, which results in the formation of free precious metal catalyst on the surface of the plastic, and then (4) electroless plating by dipping the plastic in an electroless plating bath of copper, nickel or cobalt which is chemically reduced on the treated surface until a metal plate of sufficient thickness is deposited to permit conventional electrolytic plating, such as 10-40 millionths of an inch. The precious metal nuclei catalyze the initial copper or nickel deposition from the electroless baths, causing the metals to deposit further on the initial coating by an auto-catalytic mechanism. Careful rinsing steps are essential between the baths to prevent their contamination and/or destruction.

Sensitizing step (2) and accelerating step (3) described above are sometimes reversed in order of application or even combined by using an acid colloidal tin/palladium hydrosol. Many refinements and variations are made in the electroless plating process to meet the requirements of coating various materials.

Following the electroless nickel, copper or cobalt deposition, the metal coat typically is electrolytically built up with a semi-bright nickel strike, followed by thick ductile acid copper, bright nickel and chromium electroplates. Other combinations and sequences of electrolytic coating can be used.

The complexity and sensitivity of the preelectroplate system and the sensitivity of the plastics to molding conditions have limited commercial growth of the plating-on-plastics field. A recent review of the complexities involved in the catalyzing, sensitizing and activating steps has been written by N. Foldstein in "Plating", June, 1973, pages 611-616.

Acrylonitrile-butadiene-styrene (ABS) resin is the most commonly used plastic for metal plating. However, the cost of plating grades of ABS is rather high, and the molding, surface treating, and electroless plating requirements for quality products are rigorous and add substantially to costs. Also, the properties of plated ABS are not all that might be desired.

Use of polypropylene, rather than ABS, as a polymeric base to be metal plated has certain advantages. Polypropylene is more chemically inert, has much lower water absorption, lower molded-in stresses, and is a lower cost material. However, there are also problems with plating polypropylene, especially in the form of injection molded articles. Mold shrinkage is more pronounced than for ABS, and sink marks or warpage can occur unless special care is taken in mold design. The plating process for polypropylene, starting with electroless plating, is at least as complex as for ABS. Certain special plating grades of polypropylene are available, but they are considerably more expensive than general purpose grades, hence the cost advantage over ABS is largely lost.

Other polymers have also been metal plated, such as polysulfones, polyaryl ethers, modified polyphenylene oxide, glass filled epoxy resins, and glass filled nylon. However, these are all much more expensive raw materials than the ABS and polypropylene discussed above.

Other polymers, additives and fillers have been blended with polypropylene or other plastics to improve etchability or plateability of the unmodified plastic, including talc, metal powders, reducible metal oxides and carbon black. In most cases, a preplate sequence including catalytic activation of the surface and electroless plating of the first metal layer is used.

For instance, U.S. Pat. No. 3,627,576 - Knorre et al. (1971) concerns the addition to plastic resins of inorganic fillers having functional groups that aid in the binding of catalytic metal coatings used in the electroless plating. U.S. Pat. Nos. 3,694,249 and 3,695,917 - both Abu-Isa (1972) add organic materials to polypropylene to enhance etching preparatory to catalytic treatment for electroless plating. U.S. Pat. No. 3,562,790 - Coover et al. (1971) and abandoned U.S. application Ser. No. 677,876 - Sutherland, filed Oct. 25, 1967, are concerned with tricomponent blends of (a) polypropylene and certain propylene copolymers, (b) polyethylene and certain ethylene copolymers, and (c) certain polydienes to produce compositions having various desirable properties including the ability to serve as a base for adherent metal plates, generally first applied electrolessly.

From the above discussion, it can be seen that it would also be of value to be able to reduce the number of preelectroplating steps, or preferably to eliminate the electroless plating and directly electroplate on economical plastics with good properties. Some steps have been eliminated in some processes, but optimally economical routes to the production and treatment of low cost polypropylene which can be directly electroplated with desired combinations of decorative finish and mechanical properties and without prior electroless plating are not generally known.

Other prior art provides conductive paints that can be applied to a variety of substrates to facilitate direct electroplating, such as the carbon-black-filled ABS coating of Japanese Patent Publication 46-16,437 - Ohno, published May 6, 1971. Adhesion between the paint and the substrate can be a problem in such systems.

Concerning conductive polymeric blends, conductive or antistatic vulcanized rubbers and plastics containing large quantities of graphite, carbon blacks or powdered metals have been known for many years, chiefly for the dissipation of electrostatic charges in cables, tires, belts, hospital equipment, etc. They have also been used in heating elements, resistors and radio-frequency applications. Such applications are reviewed by R. H. Norman, "Conductive Rubbers & Plastics", Elsevier Publishing Co. (New York) (1970) pages 223-258. Also, direct copper electroplating of conductive vulcanized rubber to provide electrodes for measuring conductivity has been described by R. G. Newton, Journal of Rubber Research 15, 35-60 No. 3 (March, 1946). High contact resistance on the surface is characteristic of these compositions when molded due to a thin skin of unfilled polymer. It is known that certain high-structure carbon blacks such as "Vulcan" XC-72 produced by Cabot Corp. of Boston, Massachusetts can be blended with various rubbers such as terpolymers of ethylene, propylene and dienes, to produce highly conductive rubbers. Being elastomeric, these products lack the rigidity desired in many plastic parts, especially those to be electroplated.

Uebigau, in Kuntstoffe, Vol. 49, pages 45-47 (January, 1959), describes filling phenolic molding powder with about 50 percent by weight of conductive carbon black or graphite. The surface is then roughened by sand blasting, concentrated alkali, or anodic oxidation. After degreasing and acidification, the moldings were directly copper-plated. However, the surfaces generally require post-treatments with a polishing step, using a polishing wheel or electropolishing.

Others have described similar materials which are characterized by various problems. Canadian Patent 883,425 to Nebel et al. (1971) discloses that it was previously known that resins could be metallized directly if they contained high levels of electrically conducting materials (graphite), but it notes that this impairs the mechanical strength of the resin. Also, U.S. Defensive Publication T904,012 - Staniland et al. (1972) discusses the use of up to 50 percent carbon black filler and optionally metal powders for permitting electroplatability of certain aromatic polymers including particularly polysulfones.

It is known that tensile strength of vulcanized rubber formulations can be increased by replacing part of fine particle-sized furnace carbon black with fine particle-sized platey talc filler, compared to the use of either filler alone. Also, mill shrinkage, modulus value and viscosity are reduced, and elongation is increased. Brochure 3R "United Sierra Mistron Vapor in Rubber Compounds", pages 65-69, published in about 1967 by United Sierra, Division of Cyprus Mines Corp. However, this publication does not discuss effects on electrical conductivity.

Previously published work with polyethylene filled with carbon black showed that the addition of 1% finely divided silica "Aerosil A-175" increased conductivity slightly but that 3 to 5% additions caused decreases in conductivity. Yu. I Vasilenok et al. 77 Chem. Abs. 153007 (1972).

Also, Norman, supra, pages 59 and 64, indicates that the addition of various non-conductive fillers in natural rubber plays no part in determining the resistivity which is determined only by the relative quantity of carbon black in the total compound.

Japanese Patent Publication 14,188/73 - Kobayashi, published May 4, 1973, discloses the direct electroplating of a composite blend in certain proportions of thermoplastic resin, rubber which can be etched by acid, and special types of carbon black. Examples are given with the thermoplastic being polypropylene and polyvinyl chloride, and it is also disclosed that polystyrene and polyethylene can be used. The rubber is said to aid the blending of the thermoplastic and the carbon black. The carbon blacks to be used are highly conductive, high structure blacks with an oil absorption number of 400 to 600 cc./100 g. Such high structure blacks are generally quite expensive and can increase the problems of processing. Good mechanical properties are said to result. Although these compositions can be desirable, it would be better if blends could be discovered that would not require such special carbon blacks and which would have even better processability and decorative and mechanical characteristics than these materials.

In summary, there is still a need for low cost, polypropylene-based compositions which can be formed and directly electroplated by relatively simple procedures to give plated products with optimum appearance and mechanical properties in combination.

SUMMARY OF THE INVENTION

It is a primary object of this invention to provide new compositions based on low cost hydrocarbon polymers which can be molded readily and have good mechanical properties, yet which can be plated to give bright reflective surface finishes with desirable mechanical properties.

Another object is to provide such compositions which can be electrolytically bright plated without the use of a prior electroless plating sequence.

A further object is to provide such compositions in which relatively low cost mineral additives are used, permitting the use of less carbon black and/or carbon black of lower structure, to obtain still adequately low resistivity for electroplating and improving mechanical properties of products made with such compositions.

Still another objective is to provide a process for electroplating such materials, with reduced preplating process complexity, process time, process costs, and maintenance requirements.

Yet another object is to provide molded articles and electroplated articles made from such compositions.

It has been discovered that the foregoing and other objects can be achieved with particular multicomponent blended compositions of hydrogen-based polymers which contain substantial proportions of highly conductive carbon black fillers and optionally of mineral additives. These compositions can be directly electroplated after etching and rinsing. The polymer compositions comprise (a) a propylene homopolymer or copolymer (b) a low polarity rubber and (c) an ethylene homopolymer or copolymer. Preferably, concentration of the mineral additives and concentration and high conductivity quality of the carbon black is such that the electrical volume resistivity of the molded blend is less than 25 ohm-centimeters, and the composition of the other components is chosen so that the molded bars have a notched Izod impact strength greater than 0.4 ft. lbs./in. on a ⅛ inch wide specimen at 23° C. (ASTMD256A), a heat deflection temperature greater than 48° C. at 264 psi stress (ASTM D648), and tensile elongation at break greater than 1 percent (ASTM D638). Electroplated articles of compositions of the invention preferably exhibit a peel strength greater than the 5 pounds per inch of width which is frequently required commercially.

The amounts and characteristics of the constituents of compositions of the invention are given below. Percentages and proportions herein are by weight except where indicated otherwise.

a. 20 to 69 weight percent of propylene homopolymer or copolymer with an α-olefin having less than 10 carbon atoms, having a crystalliity of at least about 25 percent, the propylene content of said copolymer being at least 92 molar percent, b. 4 to 20 weight percent of an ethylene homopolymer or copolymer with an α-olefin having less than 10 carbon atoms, having a crystallinity of at least about 25 percent, the ethylene content of said copolymer being at least 88 molar percent, c. 1 to 15 weight percent of a low polarity rubber having a low enough polarity to result in the electrical volume resistivity of the blend being less than about 25 ohm-cm in the injection-molded condition, d. 12 to 45 weight percent carbon black, having an average particle size less than about 40 m$\mu$, and a volatile content of less than about 3 weight percent, at least 15% of the total of said carbon black being a high conductivity black having a dibutyl phthalate oil absorption value of at least about 1.00 cc./gm., an iodine adsorption number greater than about 160 mg./g., and e. optionally up to 45 weight percent silicate mineral additive dispersed in said blend, substantially all of said additive being of a size that will pass through a screen having 44 micron openings, and at least 60% of the particles being samller than 10 microns in cross sectional dimension, provided that when said mineral additive is used, the combined amounts of mineral additive and carbon black are between 35 and 60% by weight of the blend. Preferred compositions comprise:

I a. 20 to 69% of said propylene homopolymer or copolymer,
b. 4 to 15% of said ethylene homopolymer or copolymer,
c. 1 to 15% rubber,
d. 12 to 29% of said carbon black, and
e. 5 to 45% of said mineral additive,

II a. 34 to 44% of said propylene homopolymer or copolymer,
b. 5 to 11% of said ethylene homopolymer or copolymer,
c. 4 to 11% of said rubber,
d. 14 to 28% of said carbon black, and
e. 20 to 30% of said mineral additive,

III a. 37 to 65 weight percent of said propylene homopolymer or copolymer,
b. 5 to 15 weight percent of said ethylene, homopolymer or copolymer,
c. 4 to 13 weight percent of said rubber, and
d. 20 to 36 weight percent of said carbon black.

Preferably, a larger proportion of the total carbon black is high conductivity carbon black, having a high structure as defined by said oil and iodine absorption tests, when a smaller total amount of carbon black is used. Thus, when the total carbon black is at the level of 12% of the blend, the ratio of high structure carbon black to other carbon black should be at least 3:1; when a total of 17% is used, the ration should be at least 7:10; when a total of 28% if used, the ratio should be at least 1:6; and at intermediate amounts of total carbon black, the minimum ratio varies proportionately.

The high structure carbon blacks used in this invention are certain types of high conductivity blacks, which generally are furnace blacks. The properties of these blacks given above are measured as follows: They have a high degree of permanent chain structure as indicated by the dibutyl phthalate oil absorption value measured on a 15 g. sample using ASTM test D2414-65T, a high surface area with an iodine absorption number measured on a 0.25 g. sample using ASTM D1510-70, a small average particle diameter as measured by electron micrograph techniques, and a low volatile content (ASTM D-1509-59). As is known in the art, these values are generally measured on the carbon black before it is compounded into the blend, but they do govern the behavior of the blends containing the blacks. The particle size can be measured in the blend by electron microscopy, or it can be measured in the powder form directly or indirectly such as by absorption techniques calibrated with electron microscopy. As discussed below, a variety of other types of carbon black can be used as the less highly structured portion of the carbon black.

The polypropylenes can be general purpose injection molding or extrusion grade homopolymers with a melt index of 0.4 to 18, preferably 0.8 to 12 g./cc. (ASTM D1505). Propylene block copolymers with ethylene are desirable and given particularly good impact properties without loss of heat deflection temperature values.

The ethylene polymers are homopolymers or preferably copolymers with up to 10 percent α-olefin of 4 to 8 carbon atoms, of high impact and high stress resistance, melt index 0.04 to 22, preferably 0.2 to 17 g./10 min. at 190° C., density 0.914 to 0.963, preferably 0.940 to 0.960 g./cc. Ethylene-butene block copolymers such as ethylene-butene-1 block copolymer, as well as random copolymers can be useful.

It is desirable that the polypropylene and polyethylene components of compositions of the invention be substantially crystalline and isotactic, having crystallinities of at least 25 percent and preferably at least 50 percent.

The low polarity of the rubber as measured by the solubility parameter of preferably less than about 9.3 aids in dispersing the carbon black and obtaining high conductivity with a minimum amount of black. The rubber aids in developing good impact strength and low temperature properties without excessive reduction of stiffness or heat deflection temperature. The rubber preferably is hydrocarbon-based, with a low degree of unsaturation.

The etchants comprise blends of $CrO_3$, $H_2SO_4$ and $H_2O$, preferably with a small amount of an aromatic sulfonic acid. Also, $H_3PO_4$, small amounts of $Cr^{+3}$ salts and other salts may be present. Preferred concentration ranges are .10 to 18 percent $CrO_3$, 30 to 50 percent $H_2SO_4$, 32 to 62 percent $H_2O$ and 0.02 to 2 percent of an aromatic sulfonic acid such as benzene disulfonic acid. An optimally desirable etch has a composition of 12 percent $CrO_3$, 39 percent $H_2SO_4$, 48 percent $H_2O$ and 0.1 percent benzene disulfonic acid.

After the etching, the parts should be rinsed. A suitable rinsing uses 1 to 40 percent NaOH solutions, at about 20 to 85° C. for 1 to 20 minutes. About 30 percent concentration at 66° C. is preferred. Alternatively, exceptionally good electroplating is obtained after rinsing in the constituents of the electroplating bath. Small amount of surface active agents can also be present in either type of rinse. It is understood that rinsing the parts in water for a few minutes with good agitation between the various steps is desirable to prevent bath contamination by entrainment.

The invention also comprises shaped articles, particularly injection molded articles and electroplated articles of the compositions of the invention and processes for molding, treating and plating the compositions.

The electrolytic steps can be those conventionally used in the plating on plastics industry, such as applying successive deposits of copper, nickel, and chromium in any of the known and accepted manners. It is particularly helpful to start with a thin strike of nickel. Alternatively, other steps and sequences can be used.

DETAILED DESCRIPTION

Materials

In order to achieve the much-sought combination of high adherence of the metal plate to the plastic, optimum decorative quality of the plated product, good physical properties of injection moldings including impact strength and heat deflection temperature, and desirable properties of the plated product including resistance to thermal cycling and thermal shock, with a relatively low cost plastic composition which is adequately electrically conductive for it to be directly electroplated without prior electroless plating, certain blends of constituents have been found to be necessary.

The desired atrributes are obtained with certain blends of four or five components in the indicated ranges:

20 to 69 percent polypropylene,
12 to 45 percent carbon black,
1 to 20 percent rubber,
4 to 20 percent polyethylene, and
up to 45 percent mineral filler.

The components are of certain types described above.

The omission of any one of the required components, or significant departures from the expressed ranges, will result in substantial losses in various of the desired characteristics.

Polypropylene is the principal polymeric constituent in order to obtain the mechanical properties and low costs characteristic of polypropylene.

If the polyethylene is left out of the blend, it is not feasible to obtain the desired combination of plate appearance and adhesion. Apparently the polyethylene in some ways not fully understood changes the properties of the polypropylene-carbon black-rubber blend so that it interacts with the surface preparation treatments and the electroplate to give a brighter and more adherent plated product. This could be due to a combination of effects on the thermal expansion, hardness and etchability of the blends, as well as other effects.

It is important that a low polarity rubber be used to obtain the sought conductivity along with the impact resistance and other properties. The polarity of the polypropylene and polyethylene constituents of the blend is already low even when they are copolymers with certain other α-olefins. Higher polarity would be mainly contributed by non-hydrocarbon atoms such as oxygen, nitrogen sulfur and halides. The rubbers may have non-hydrocarbon groups, but only so long as the resulting polarity is kept low enough to disperse the carbon black in the blend properly.

The polymers found most useful in formulations of this invention apparently have little interaction with the carbon black particles. Conductive carbon black is made up of particles fused together to form nodular aggregates. In most cases, these aggregates do not break up during dispersion and processing. Rather, the dispersion process consists in breaking up large agglomerates of the nodular aggregates, which have compacted together. Theories of electrical conductivity of carbon black agree that the carbon black aggregates must be in contact or separated by a very small distance, such as less than 100 A to maximize conductivity. Therefore those factors which increase contact of aggregates, or which separate aggregates by only very small distances, will increase conductivity. Thus the greater the number of aggregates for a given weight of carbon black, the greater the conductivity.

Rather large amounts of carbon black are used to obtain the conductivity needed for direct electroplating. It is important to use a high-conductivity, high-structure carbon black as at least part of the carbon black to minimize the amount required to obtain any particularly conductivity, because excessively large amounts of carbon black tend to damage the mechanical properties of the blends and make processing very difficult. Also, it has surprisingly been found that less carbon black, and a smaller proportion of high-structure carbon black can be used along with mineral fillers to obtain adequate conductivity with good processability.

Three basic carbon black properties affect the interaggregate distance for a given carbon black loading in a polymer system. They are the size of the nodular aggregates which are the primary particles, the aggregate shape or structure, and porosity. The smaller the nodules, the more aggregates are present. Also, higher structure or chain-forming tendency of the aggregates produces more contact and decreases the separation. Furthermore, the more porous the nodules, the larger the number of aggregates for a given weight of black and consequently the greater the conductivity. The oil absorption of a black is indicative of its degree of structure. The iodine absorption, or alternatively the nitrogen absorption, is indicative of the actual total surface area or, in effect, the porosity of the aggregates. Coupled with the average particle size including the aggregates and the nodules present, these measurements are important in determining the suitability of a high structure carbon black for use in the present invention. Other types of carbon blacks that can be used in the invention along with high structure blacks are discussed below in conjunction with Table II.

In addition to the above properties, there should be a low level of oxygen-containing groups in the blacks, such as hydroquinones, quinones, lactones, or carboxylic acids. These groups tend to reduce the mobility of the free electrons. Thus, high color channel blacks, although they have high porosity, structure and small nodule size, still have considerably lower conductivity than the conductive furnace blacks, and they are not desirable in the present invention. Indication of the presence of these undesired groups in channel blacks is seen in a typical high volatiles content of 5 to 15 percent contrasted with the presently preferred 1 to 2 percent. Furnace blacks generally have been subjected to a greater degree of pyrolysis and are more suitable for use in the present invention. Certain carbon blacks available commercially provide the required characteristics. Other carbon blacks or blends of blacks could be made which would also be adequate. Informative discussions on carbon black technology are found in "Conductive Rubbers and Plastics" by R. H. Norman, cited above, in "Reinforcement of Elastomers" by G. Kraus, John Wiley & Sons (1965), and in U.S. Pat. No. 3,364,156 - Kraus (1968).

It can be seen, then, that polymeric media which encourage close proximity or contact of the carbon black aggregates will maximize the conductivity of the formulation. To obtain as low a level of carbon black as possible for good molding properties, while maintaining high conductivity, the polymeric medium should not disperse the carbon particles too well, or the structure and chain formation of the black could be diminished and the interaggregate distances will increase and could become too great for the desired conductivity to be obtained. However, the polymers should have some dispersing capability or the carbon black will be so heterogeneously dispersed as to give a poor nucleating surface for the subsequent electroplating steps. Certain desiderata in obtaining highly conductive carbon-black-filled plastics are expressed in U.S. Pat. No. 2,683,669 - Coler. However, that patent does not teach how to obtain such effects in compositions of the present invention.

In order to obtain the proper type of dispersion of the carbon black in the blend, it is desirable to use a rubber with a low enough polarity to result in the electrical resistivity of the blend in the injection molded condition being less than about 25 ohm-cms. Preferably, the polarity will be at a level indicated by a solubility parameter of less than about 9.3. The solubility parameter of the polypropylene and polyethylene components will also be below about 9.3.

Table I lists various polymers in order of increasing solubility parameter, $\delta$, including elastomers, polyolefins and others for purposes of comparison. The solubility parameter is the square root of the cohesive energy density. The values given for $\delta$ are approximate. These values may be obtained in several ways, as described in the Encycl. of Polymer Science & Technology, Vol. 3, pages 833–862, Editor H. F. Mark et al., Wiley & Sons, N.Y.C., (1965). The interaction of polymers with solvents can be correlated with similarity of the $\delta$ values of the polymer and the solvent in which the polymer has its maximum solubility, provided complicating features such as hydrogen bonding, association of solvent and solute, and crystallinity are not involved. Although some polymers of interest in this invention have various amounts of crystallinity, the contribution of crystallinity to the solubility parameter may be neglected because the elastomers have little if any crystallinity and the polyethylene and polypropylene constituents, being olefins without polar groups, are sufficiently low in polarity before crystallinity is considered. It now appears that the level of interaction between polymers and fillers is related to the solubility parameter. Thus, the polymeric components of value in the present invention generally have $\delta$ values below about 9.3. Polarity and solubility parameters of polymers are also discussed extensively by R. D. Deanin in "Polymer Structure, Properties and Applications", Cahners Publ. Co. (1972), especially on pages 288–309. Also, U.S. Pat. No. 3,658,752, Das et al. discusses the role of the solubility parameters in determining the incompatibility of plastics and elastomers which can be made into stable blends by using reinforcing particulate fillers.

TABLE I

SOLUBILITY PARAMETER VALUES OF CERTAIN POLYMERS ($\delta$)

| Polymer | $\alpha$ |
|---|---|
| Polypropylene | 6.0–7.9 |
| Polyethylene | 7.9–8.4 |
| Ethylene/propylene copolymer | 7.0–7.9 |
| Ethylene/propylene/diene terpolymer | 7.0–7.9 |
| Polyisobutylene | 7.7–8.05 |
| Polyisoprene (natural rubber) | 7.9–8.2 |
| Styrene-butadiene rubber (25% styrene) | 8.1–8.6 |
| Polybutadiene | 8.1–8.6 |
| Polysulfide rubbers | 9.0–9.4 |
| Polystyrene | 8.5–9.7 |
| Polychloroprene | 8.8–9.4 |
| Polymethylmethacrylate | 9.0–9.5 |
| Polyvinyl acetate | 9.4 |
| Poly(butadiene acrylonitrile) | 9.5 |
| Polyvinylchloride | 9.6 |
| Polymethylacrylate | 9.9 |
| Poly(ethylene terephthalate) | 10.7 |
| Poly(vinylidene chloride) | 12.2 |
| Nylon 6-6 | 13.6 |
| Poly(methyl cyanoacrylate) | 14.0 |
| Poly(vinyl alcohol) | 13.5–15.5 |
| Polyacrylonitrile | 15.4 |

Although it could be done, it has not been found necessary to cross-link the rubber or other polymeric components of the composition after blending or forming. Unvulcanized rubbers are used in making blends of the invention, although this does not exclude the possibility that some minor amounts of cross-linking could be present in the rubbers to be used.

Carbon blacks that have been used in exploring this invention are listed in Table II along with relevant properties. The "Vulcan" carbon blacks are products of the Cabot Corporation of Boston, Massachusetts.

In addition to the two higher-structure blacks at the top of Table II, extra conductive furnace or ECF and super conductive furnace or SCF, the table also includes the following blacks which can be used as the lower-structure black in conjunction with the higher structure black: conductive furnace or CF, super abrasion furnace or SAF intermediate super abrasion furnace with high to medium structure and with low structure or ISAF-HM and ISAF-LS, and high abrasion furnace or HAF.

TABLE II

| | CARBON BLACKS | | | | | |
|---|---|---|---|---|---|---|
| ASTM Class | Name | DBT Oil Absorption (cc./g.0 | Iodine Absorption (mg./g.) | $N_2$ Surface Area ($m^2$/g.) | Particle Diameter (m$\mu$) | Volatile Content (%) |
| N 472 (ECF) | "Vulcan" XC 72 | 1.67–2.00 | 230–270 | 250 | 29 | 1.8 |
| N 294 (SCF) | "Vulcan" SC | 1.0–1.1 | 190–222 | 200 | 21 | 2.5 |

TABLE II-continued

| | | CARBON BLACKS | | | | |
|---|---|---|---|---|---|---|
| ASTM Class | Name | DBT Oil Absorption (cc./g.0 | Iodine Absorption (mg./g.) | $N_2$ Surface Area ($m^2$/g.) | Particle Diameter (mµ) | Volatile Content (%) |
| N 293 (CF) | "Vulcan" C | 0.94–1.06 | 134–156 | 145 | 23 | 2.5 |
| N 296 (CF) | Ashland "United" | 1.14 | 120 | — | 19 | 2.5 |
| N 110 (SAF) | "Vulcan" 9 | 1.2 | 125–155 | 124 | 20 | 1.5 |
| N 220 (ISAF-HM) | "Vulcan" 6 | 1.1 | 110–140 | 115–125 | 23 | 2.5 |
| N 219 (ISAF-LS) | "Regal" 660 | 0.54 | 105–135 | 92 | 23 | 2.5 |
| N 330 (HAF) | "Vulcan" 3 | 1.3 | 70–90 | 74–86 | 29 | 1.0 |

The carbon black used most successfully as the high-structure carbon black has been "Vulcan" XC-72. Somewhat less effective but often acceptable is "Vulcan" SC. Polymer compositions made with the latter grade of carbon black generally have lower conductivity and a rougher surface, in spite of a finer carbon black particle size. A grade of conductive furnace black which led to unsatisfactory conductivity and surface characteristics was "Vulcan" C, except when used in conjunction with one of the high-structure carbon blacks.

The high structure carbon blacks appropriate to this invention not only make the polymer compositions electrically conductive, but also increase the rigidity of the composition, increase resistance to distortion under stress and lower the shrinkage on cooling in the mold. The thermal conductivity is also increased over the unfilled polymer, making the composition more resistant to sink mark formation on molding and more resistant to breakdown on thermal cycling and thermal shock exposure. Furthermore, these particular conductive blacks permit an adequate electrical conductivity to be reached for subsequent electroplating without such high concentrations of carbon black and mineral filler as would interfere with injection molding or damage mechanical properties.

As indicated above, associated with the proper choice of carbon black for good conductivity is the proper choice of plastic composition in order to obtain mirror-like finishes with good adhesion along with good overall physical properties. Other polymers and blends of polymers outside the invention when compounded with an amount of "Vulcan" XC-72 generally needed for electroplating, about 30 percent, give unsatisfactory results.

Thus, a commercial molding and plating grade of ABS resin blended with 30 percent "Vulcan" XC-72 exhibited poor flow and decomposition on attempted injection molding. Another ABS composition containing 30 percent carbon and 5 percent EPDM rubber molded fairly well and could be directly electroplated. However, plate appearance and adhesion were poor. A 6,6-nylon containing 30 percent "Vulcan" VC-72 gave rather low conductivity and also a relatively brittle composition with a notched Izod value of about 0.4 ft. lb./in. Increasing the carbon level for higher conductivity gave a very brittle composition. A 78/22 nylon 6/"Vulcan" XC-72 blend also gave low conductivity coupled with high brittleness, notched Izod impact of only 0.16 ft. lb./in. Higher carbon content for more conductivity would again lead to extreme brittleness.

Blends of conductive carbon with polyethylene, polypropylene, ethylene/vinyl acetate or ethylene/ethyl acrylate copolymers are known. However, carbon-filled polyethylene, for instance, used for cable insulation, has very low heat deflection temperatures, below 48° C. with 264 psi stress, which could lead to distortion in etching and electroplating baths.

Suitable propylene polymers for use in the invention include those in Table III. They are referred to hereinafter by the type designations A to E. These types are available as the indicated "Profax" polymers which are products of Hercules, Inc., of Wilmington, Delaware. Propylene block copolymers with 2 to 3 molar percent ethylene have a high impact strength and are particularly desirable.

For both the propylene copolymers of Table III and the ethylene copolymers of Table IV, density correlates in a non-linear way, generally inversely, with comonomer content. If the density is known it is often not necessary to measure the actual comonomer content.

TABLE III

| | | POLYPROPYLENES | | |
|---|---|---|---|---|
| Type | Name | Description | Density (g./cc.) | Flow Rate (g./10 min. at 230° C) |
| A | "Profax" 6523 | general purpose homopolymer | 0.904 | 12.0 |
| B | "Profax" 6723 | general purpose homopolymer | 0.903 | 0.8 |
| C | "Profax" 6601 | homopolymer in flake form | 0.903 | 1–3.5 |
| D | "Profax" 7623 | intermediate impact grade copolymer with ethylene | 0.902 | 2.0 |
| E | "Profax" 8623 | high impact grade copolymer | 0.904 | 2.0 |

Rubbers used in the invention should have enough heat and shear stability in the presence of moderate amounts of conventional stabilizers to impart good impact strength values after the compounding step. They also have low to zero crystallinity such as natural rubber or a synthetic polymerized polyene, preferably contain 40 to 80 percent ethylene and have a low level of residual unsaturation with less than about 10 percent diene.

Certain desirable EPDM-type rubbers (ASTM D1418-71) are terpolymers of 20 to 80 percent, preferably 50 to 75 percent by weight of ethylene units, at least 0.1 gram mole of ethylenically unsaturated side chains/Kg of polymer, such as in the form of 2 to 4 weight percent 1,4-hexadiene, and the balance propylene. Representative non-conjugated dienes for use in making EPDM-type rubbers include aliphatic dienes such as 1,4-hexadiene, cycloaliphatic dienes such as 1,5-cyclooctadiene, 5-alkylidene-2-norbornenes such as 5-ethylidene-2-norbornene and 5-methylene-2-norbornene, 5-alkenyl 2-norbornenes such as 5-propenyl-2-norbornene, and 5,6-alkenylene-2-norbornenes such as dicyclopentadiene. Representative copolymers including particularly terpolymers that can be part of such rubbers are described in U.S. Pat. Nos. 2,933,480; 3,000,866; 3,063,973; 3,063,620; and 3,063,621. Copolymers can contain units of a direactive fourth monomer that functions as a branching agent, such as 1,4-octadiene or 2,5-norbornadiene (which is preferred) or selected polybutadienes. Representative tetrapolymers for use as such rubbers are described in U.S. Pat. No. 3,652,729 and Canadian Pat. No. 855,774.

Where the term "EPDM elastomer" is used hereinafter it refers specifically to a pelletized EPDM-type rubber containing, by weight, about 70.5 percent ethylene, 26 percent propylene, and 3.5 percent 1,4-hexadiene monomer units and having a Mooney viscosity of about 60 measured on a large rotor heated to 121° C. for 1 minute and turned for 4 minutes. Tested under such conditions, rubbers used in this invention in general have a Mooney viscosity range about in the range of 15 to 75.

Useful rubbers also include butyl rubber such as a 98/2 isobutylene/isoprene copolymer, density 0.92 g./cc. and molecular weight around 60,000 and polyisobutylene with a molecular weight around 80,000. Lower impact values result with the same amounts of natural rubber, styrene/isoprene, or styrene/butadiene block copolymers. Also suitable are: SBR which is a free-radical-catalyzed random copolymer containing about 76.5 percent 1,3-butadiene and 23.5 percent styrene; and Ziegler-catalyzed random copolymers of ethylene and propylene such as those described in U.S. Pat. Nos. 3,000,867 and 3,300,459. However, these are still operable. As is known in the art, the rubbers should contain sufficient concentrations of suitable antioxidants and sometimes also chelating agents to maintain desirable characteristics during compounding, molding and subsequent use, while they are subject to attack by oxygen. As is known, the rubbers of this paragraph are more or less susceptible to such problems and may need such treatment, depending on the way in which they are to be used.

The crystalline ethylene/α-olefin copolymers of this invention can include copolymers of ethylene with 1-octene, 1-butene, propylene, 1-pentene, 1-hexene, 1-dodecene, or mixtures of these comonomers. Ethylene copolymerized with a small amount of 1-octene comonomer is particularly desirable. Less preferred but still operable are the high density ethylene homopolymers, flow rate 0.05 to 30.0, preferably 1.2 to 20, density 0.936 and 0.963. These give attractive plated surfaces but require etchant baths to operate at higher temperature to develop good peel strength values. Levels of polyethylene of over 20 percent in the composition can lead to plate with low peel strength. Also useable are the low density polyethylenes with a density of 0.914 to 0.930 g./cc. and a flow rate of 1.0 to 30.0. However, blends using such compositions do not plate as readily or give as good physical properites. Suitable ethylene polymers for use in the invention include those in Table IV.

TABLE IV
POLYETHYLENES

| Type | Description | Density (g./cc.) | Flow Rate (g./10 min. at 190° C.) |
|---|---|---|---|
| A | low density molding grade homopolymer | 0.919 | 1.9 |
| B | high density molding grade homopolymer | 0.960 | 2.8 |
| C | high strength copolymer with <5% octene | 0.955 | 1.2 |
| D | medium density copolymer with <10% butene | 0.940 | 4.0 |
| E | high density molding grade homopolymer | 0.960 | 17.5 |

The mineral additives which should be included in this invention include certain grades of talc (magnesium silicate), Wollastonite (calcium silicate), Kaolin clay, aluminum silicate, and asbestos. In general, finely divided grades of these additives are required and the more hydrophobic additives are preferred, such as talc or Wollastonite (calcium silicate), Specifically, at least 60% of the particles should be less than 10 microns in cross sectional dimension, and substantially all, at least about 99.8%, should pass through 325 mesh screen (44 microns), with a Hegman Fineness Test value of 5 or greater in order that the plated products have a mirror-like finish. Preferred values of particle size distributions are at least 70% less than 10 microns, at least 99.9% pass through a 325 mesh screen, and Hegman Fineness test values 5.5 or greater. Suitable commercially available materials include No. 1731 "Micro Talc" sold by Whittaker, Clark & Daniels, Inc., 1000 Coolidge Street, South Plainfield, N.J. 07080, "Cab-O-Lite" (Wollastonite) grade P-4 sold by the Interpace Corporation, Willsboro, N.J. 12996, "Mistron Vapor" (talc) sold by the United Sierra Division of Cypress Mines Corp., Trenton, N.J.

The mineral additives may be used directly or after simple drying, water washing, or calcining. They may also be surface-treated as known in the art by physical or chemical modification to give further enhancement of properties, particularly in modulus, tensile and impact strengths, abrasion resistance, and reduced creep. Examples of valuable surface treating agents are acrylic acid plus peroxides, unsaturated silanes, produced by the Union Carbide Chemical Co., such as A-172 and A-174 silanes, particularly if used in conjunction with a peroxide, such as dicumyl peroxide, or certain unsaturated cationic-functional trialyloxysilanes produced by Dow Corning Co. plus peroxides. These surface treatment agents can be prereacted with the mineral additive, or can be reacted in-situ in the extruder or blender.

The level of these mineral additives which can be used is up to about 45%, with preferred level of mineral about 15–30%. Preferably at least 5% mineral additives are used, and at the higher levels of mineral additives the carbon black is preferably low, such as 15 to 22%. In the case of very high mineral loading, the level of carbon black used would be as low as 14%. The maximum desirable level of combined non-conductive mineral and carbon black is around 55 to 60% and the combined minimum desirable level about 35 to 40%, with the preferred combined level 40 to 50%.

The above preferred composition ranges permit the molded bars to have good physical and electrical conductivity properties, with the resistivity being below about 20 ohm-cm, notched Izod impact strength at least 1–1.5 ft. lbs./inch notch, heat deflection temperature at 66 psi 85°–117° C, 1% secant flex modulus of 300,000–325,000 psi. Thus, compositions of this invention can be comparable to plating grade as ABS regarding stiffness and mold shrinkage, somewhat lower in notched Izod impact, and better than ABS in heat deflection temperature at low stress levels.

It has been found that blends with mineral additives can have less mold shrinkage than such blends without the additives. This can give shrinkages equivalent to those with ABS, so that molds made for use with ABS can be used with such blends. Also, the mineral additives can improve stiffness values, flexure and tensile moduli, and heat deflection temperature. Thus has the net effect of decreasing the likelihood of warpage in warm etchants and plating baths, making products and processes less sensitive to the location of and tension from support racks and to the size, shape and weight of the articles.

Additional finely divided fillers and other materials can also be included in the blends without materially affecting the basic and novel characteristics of the invention. Examples include up to about 20 percent of ZnO, calcium carbonate, $TiO_2$ (rutile), quartz, precipitated silica, fibrous potassium titanate, and finely divided metals and metal oxides, such as of iron, nickel or aluminum. Other fillers known in the art could also be used. With these fillers, the thermal shock resistance is improved still further, but the appearance may be rougher, and blending and molding operations may be more difficult. The ZnO filler appears to give the best surface quality, perhaps by being soluble in the rinses that can be used as well as in the etchants.

Other additives in small amounts are also useful, including stabilizers, such as dilauryl thiodipropionate, very small amounts of polyglycols, such as "Carbowax" 6000, 1 phr to increase the effectiveness of the peroxide, and even molding lubricants such as calcium stearate, provided they do not interfere with the electroplating of the molded objects. The use of the combination of antioxidants and high concentrations of carbon black in these compositions should give high levels of resistance to embrittlement on outdoor exposure of the unplated areas; better than the presently used ABS.

Processes

These components can be formed into the desired composition by any suitable processing techniques which achieve a uniform, relatively homogeneous blend. Thus, all the components can be blended in a conventional Banbury mixer, fluxed, granulated, and then fed to an injection molder to give the shaped articles. Still better results are obtained by dry blending powdered or pelletized components by rolling, rotation, or ribbon blending, followed by feeding to a twin screw extruder. Independent metering of the carbon black and mineral additives into the extruder shortly after the polymers are fed permits the best control. The extruded strand is chopped to a size acceptable for feeding to an injection molder. In some cases, dry powder blending is good enough to permit direct introduction to a reciprocating screw injection molder, without requiring an extrusion step. Another method which gives very high quality parts is to blend all the polymer components and stabilizers first on a rubber mill, in an extruder or in a Banbury mill, granulate the product, dry blend with the carbon black by rolling, extrude in a twin screw extruder, and mold in a reciprocating screw injection molder. Extended blending improves the surface characteristics of the plated object. On the other hand, it is important, in order to attain maximum conductivity, to avoid overmixing. Mixing in the Banbury should be carried out only to the point that the dispersion rating is good-to-excellent by usual examination procedures (ASTM D2663-67T). Usually up to 15 or 20 minutes Banbury blending time is permissible with these compositions before conductivity drops. The butyl and EPDM types of rubber are particularly versatile in permitting extended blending. Wet blending of some or all of the constituents with the polypropylene as it emerges from the polymerization reactor is also within the scope of the invention.

The resulting compositions can be molded, using conventional molding equipment and techniques used for molding filled polyolefins.

Once the article is formed, it is ready to be metal plated following a minimal preparation sequence. The basic procedure is (1) to condition the surface with a strong acid solution containing an oxidizing agent such as chromic acid, and (2) to rinse the article before placing it in the electroplating bath. Plated articles can be produced with metallic coatings from less than 0.1 mil to more than 2 mils in thickness.

One preferred aqueous conditioner solution composition for compositions not containing the mineral additives contains 30 g. $CrO_3$, 20 g. $K_2Cr_2O_7$, 160 g. concentrated (96%) $H_2SO_4$ and 790 g. concentrated $H_3PO_4$. The solution has a specific gravity of 1.60 g./cc. at 49° C., and the article is rotated or the bath stirred for about 5–15 minutes. A surfactant may also be present in small amounts to help wet the surface. For composition containing the polyethylene homopolymer rather than crystalline ethylene/α-olefin copolymers, this etchant bath is preferably operated at higher temperatures, up to 84° C. for about 5 minutes.

Also, a stronger etchant may be used. One such bath contains 100 g. $CrO_3$, 375 g. concentrated $H_2SO_4$, 375 g. $H_3PO_4$ and 150 g. $H_2O$. A particularly preferred bath contains 180 g. $CrO_3$, 560 g. $H_2SO_4$, 680 g. $H_2O$, and 1.5 g. benzene disulfonic acid. A suitable commercial etchant is a "Macuplex" L-43 Etchant, produced by MacDermid, Inc., Waterbury, Conn. A less effective but still useful bath contains 300 g. $CrO_3$, 250 g. $H_2SO_4$ and 450 g. $H_2O$.

Less desirable etchant baths contain 150 g. $CrO_3$, 150 g. $H_2SO_4$ and 700 g. $H_2O$, or 400 g. $CrO_3$, 150 g. $H_2SO_4$, 450 g. $H_2O$. Thus, high acid concentration appear desirable in general; with high $H_2SO_4$ concentrations preferred for the homopolymer-containing compositions, and high $H_3PO_4/H_2SO_4$ ratios useful for the copolymer-containing compositions.

After the surface-conditioning treatment, the article is subjected to a warm water rinse, and then dipped into a sodium hydroxide rinse bath. For the preferred compositions and conditioner treatment, a rinse bath of 30 percent NaOH at 66° C. is preferred. The rinse bath is even more effective when used with ultrasonic agitation. After another $H_2O$ dip the piece is ready for electroplating.

Another effective rinse bath is a solution of 37 percent hydrochloric acid containing 0.2 percent of an anionic surfactant such as Du Pont's TLF 3141, and 0.1 to 0.2 percent of a chelating agent, such as ethylene diamine tetraacetic acid.

An additional rinse bath of 10 percent $H_2SO_4$ at room temperature for 20 seconds can be used after the alkaline rinse and before the electrolytic copper or nickel bath, to insure no reduction of the acidity of the copper bath by alkaline entrainment.

It has been found particularly desirable to use as a rinse the chemicals of the first electroplating bath at elevated temperature but without any applied voltage. This seems to increase the receptivity of the molded article to the subsequent electroplate.

In addition to the basic preplate steps indicated above, more enhancement in adhesion may also result with the use of preconditioning baths in which acids or certain unsaturated organic solvents, such as turpentine or oils, with or without surfactants, penetrate the surface of the substrate and facilitate later penetration and etching by the chromic-sulfuric acid conditioner solution. These can also be aplied in aqueous dispersion. An available proprietary commercial bath of this type is "Pro Prep" D-40, a product of the MacDermid Company.

Also useful for removing organic preplate treating agents before entry into the conditioning bath is a rinse bath of moderate strength chromic acid. An example of a commercially available proprietary rinse is "Macuplex" L-56 acid cleaner, also a product of the MacDermid Company.

A preferred conditioner for compositions containing the mineral additives contains 175 g/l $CrO_3$ (12.0%), 630 g/l $H_2SO_4$ (43.5%), and about 645 g $H_2O$ (44.5%). Specific gravity is 1.450 to 1.455 at 50° C., about 1.47 at 23° C. (with precipitation of $CrO_3$). Activity is still further enhanced with about 1.5 g/l of benzene disulfonic acid and 0.17 to 0.34 g/liter of an acid stable, oxidation stable fluorosurfactant, such as Minnesota Mining and Manufacturing Co. product known as FC-98. The latter lowers the surface tension of the etchant bath from over 48 dynes/cm to below 24 dynes/cm., which was found to improve adhesion of the electroplate. The range of concentrations for this etchant bath which gives good etchant results has $CrO_3$ concentrations of 155 to 195 g/liter $CrO_3$, and 590 to 670 g/liter $H_2SO_4$, with 165 to 185 g/liter $CrO_3$ and 610 to 650 g/liter $H_2SO_4$ preferred. Temperature and time of application appears best at 38 to 60° C./5-30 min., with 40 to 55° C./10-15 min. preferred. Having the $CrO_3$ at the point of saturation gives the etchant maximum activity. High adhesion (high peel values) are possible with this etchant bath.

It is important to note that the concentration of components in this bath are considerably different from those used commercially for ABS. Thus, the MacDermid "L-55" bath for ABS contains about 400 g/l (27%) $CrO_3$ 354 g/l (24%) $H_2SO_4$ and 708 g/l (49%) $H_2O$. Thus, much less $CrO_3$ is in the bath of this invention, which reduces pollution control requirements in the rinse waters caused by drag-out of etchant. Also, the commercial bath operates at a higher temperature, 66° C., with a hot preconditioner bath required, MacDermit's "L-56". The bath of this invention operates best at 40°-55° C., and so changes in concentration of bath due to evaporation are diminished, probably resulting in a lower level of etch of plastic, and therefore a longer bath life, and the bath requires fewer analyses for maintenance. A preconditioner bath is generally not necessary with the present invention, although if the articles are highly contaminated, a pretreatment with surfactant solution or a mild oxidizing solution would help prepare the articles for the etchant step.

After the surface conditioning treatment the article is given a water dip, and then immersed into a chemical treatment bath which removes chromium ions. This insures negligible contamination of the subsequent electroplating bath. The preferred chemical treatment bath is an acidic solution containing fluoride ions, such as results on mixing about 92% $NaHSO_4$ and 8% NaF, or 94% $NaHSO_4$ and 6% $HaHF_2$, with a total concentration of about 4-16%. The bath temperature/time is preferably about 60°-65° C. for 2 minutes, but can also be run effectively at room temperature. After another dip into $H_2O$, the article is ready for electroplating.

Another effective rinse bath is 30% NaOH solution at 65° C./5 min. Somewhat less effective is 5% NaOH at 65° C./5 min. Still less effective is 5% NaOH at room temperature.

The articles are now ready for electroplating without the usual chemical treatment and water rinse steps required in conventional plating on plastics systems. That is, no catalyst deposition, activation, acceleration, or electroless metal deposition steps are required. A thick layer of copper (0.6 to 1.6 mils) could be plated directly using a ductile bright acid copper plating bath, such as "UBAC" No. 1, a product of the Udylite Corporation, followed by the usual semibright and bright nickel baths and the chromium plating baths for maximum appearance and durability as is well known in the plating art. Somewhat better appearance and adhesion can be obtained by using a Wattstype nickel strike bath before the copper or nickel plating baths. Other strike baths, such as a copper strike can also be used, followed by other plating baths known to the art, such as cyanide copper, white brass and acid zinc. Conventional proprietary and nonproprietary electroplating techniques and materials known in the art can be used throughout. A method that can be used in electroplating materials such as this to obtain good coverage near the contacts, starting with a low voltage induction period is described in British Pat. No. 1,384,116, published February 19, 1973 and assigned to Cabot Carbon Limited.

Experimental Measurements

The electrical resistivity of molded compositions in ohm-cms. was measured by painting two conductive strips across the length of an impact testing bar, 0.5 in. wide and 0.125 in. thick, with a conductive silver paint, such as Conductive Composition No. 4929, a product of E. I. du Pont de Nemours and Company of Wilmington, Delaware, diluted with butyl acetate to a viscosity of 5 to 10 poises. The conductive strips were 1½ in. apart. A conductive copper bar assembly was placed on the painted areas under 519 g. force, and the resistance between the painted areas was measured with a Triplett Model 631 Ohmmeter. The geometry of the unpainted area is equal to 2.25 squares.

Resistance was independent of applied pressure. From the equation $R = \rho \times 1/A$, where R is resistance in ohms per cm of path length, $\rho$ is volume resistivity in ohm-cms, A is cross sectional area in cms², thus, for an impact bar ½ inch wide and ⅛ inch thick, and separation of painted lines as 1⅛ inches, $\rho = R \times A = $ (ohms $\times$ (½ $\times$ ⅛) $\times$ 2.54 2⅛) = ohms $\times$ 0.142. This method does give a good estimate of the volume resistivity, as evidenced by the fact that values are not appreciably changed by change in bar thickness or change in total applied force.

Flow rates of the resins were measured in units of g./10 min. according to ASTM D1238L-62T at 230° C. for the polypropylene and according to ASTM D1238E-62T at 190° C. for the polyethylene materials.

The heat deflection temperature (HDT) at 264 psi was measured using ASTM method D648. The tensile strength at yield, the tensile strength at break, the tensile elongation at break, and the initial tensile modulus were obtained as in ASTM D638, pulled at 2 in./min. on specimens 5 in. × ¾ in. × ⅛ in. The flexural modulus, 1 percent secant, 0.05 in./min., was run according to ASTM D790B. Notched Izod impact strength was measured acccording to ASTM D256-72a on specimens 2½ in. × ½ in. × ⅛ in.

Peel tests as a measure of adhesion were run on copper plated tensile dumbells. The plate was 1.0–1.25 mils thick, aged at least 10 days after plating. Grooves one-half inch apart were machined through the plate, to give a strip ¼ inch wide down the length of the dumbell. Ninety degree peel tests were run at 1 in./min. on an inclined plane Chatillion tester, and the results were reported in units of pounds per inch of strip width.

Thermal cycle and thermal shock tests were performed on parts plated successively with 1 mil thick bright acid copper, 0.5 mil bright nickel, and about 0.01 mil chromium. The thermal cycles were 1 hr. in hot $H_2O$ (185° F.) 15 min. at room temperature, 1 hr. in a 55/45 ethylene glycol/$H_2O$ freezing mixture at −30° F. to −35° F., and 15 min. at room temperature. Plated objects were submitted to 3 cycles. A rectangle was cut through the plate at the center of the object to eliminate any edge effects. A specimen is considered to have failed the test if the plating buckles or delaminates. It has been reported that injection molded and plated plating grade ABS failed this thermal test after 2 cycles in 6 out of 8 samples.

The thermal shock test used a cycle of 30 min. to 1 hour in boiling $H_2O$, then prompt immersion under dry ice at −80° C. for 1 hour. Samples were given 2 to 3 cycles of exposure. The same failure criteria apply as for the thermal cycle test. All ABS samples tested failed this test after one cycle.

Mold shrinkage in the direction of flow in the mold was determined on ⅛ inch thich unplated specimens, as described in ASTM D955-51, but with molding conditions described in the examples. The measurements were all made after 48 hours.

Other tests, such as on component materials, are indicated in preceding parts of this text.

Specific examples and comparative tests are given below to illustrate the invention and its place in the art. The types of polypropylene and polyethylene are given in Tables II and III above. The EPDM elastomer used is described above. Except where indicated otherwise, the carbon black used is "Vulcan" XC-72.

EXAMPLE 1

50 PP/30 C/10 EPDM/10 PE

A dry blend was made with 1,000 gms. (50%) of Type B polypropylene, 600 gms. (30%) carbon black in pelletized form, 200 gms. (10%) granular EPDM elastomer, and 200 gms. (10%) Type C polyethylene. The blend was then passed through a 28 mm. Werner and Pfleiderer twin screw extruder with the barrel heated to 250° C., to give a melted blend temperature of 282° C. Screw speed was 200 rpm with a die pressure of 375 psi. The extruded blend was cooled and chopped into short lengths which were later injection molded to form 6" tensile dumbbell stock and 5 in. Izod impact bar stock in a 1.5 oz. reciprocating screw injection molder at 280° C. barrel temperature, 60° C. mold temperature, 25 seconds full travel ram speed, 25 seconds hold time, 900 psi injection pressure and with a screw speed of 60 rpm.

Physical properties of the injection molded bars were tensile yield stress 3400 psi, tensile strength at break 3400 psi, tensile elongation at break 3.2 percent, 1 percent secant flex modulus 223,000 psi, notched Izod impact strength 4.1 ft. lb./in., heat deflection temperature 55° C. at 264 psi, volume resistivity 4.2 ohm-cms. The mold shrinkage was 1.60 percent, compared to 2.02 percent for Type C polypropylene not compounded with the other components used here.

To produce an electroplated coating of Cu/Ni/Cr, a bar of the type described above was given the following preplate and plating sequence: (1) dip in MacDermid's "Proprep" D-40 pre-etch penetrant solution at 73° C. for 7 minutes, (2) rinse in $H_2O$ at room temperature 2 minutes, (3) dip in MacDermid's acid cleaner L-56 at 58° C./2 minutes, (4) dip in a bath composed of 79 percent $H_3OP_4$ (85 percent basis), 16 percent $H_2SO_4$, 3 percent $CrO_3$, and 2 percent $K_2Cr_2O_7$, at 47° C./5 minutes, (5) rinse in warm water for 2 minutes, (6) dip in 5 percent NaOH at 66° /5 minutes, (7) rinse, (8) dip in 10 percent $H_2SO_4$ at room temperature for 20 seconds, (9) plate in a bright acid copper electroplating bath, such as "UBAC" No. 1, a proprietary product of the Udylite Corporation, Detroit, Michigan, with a current of 1.7 amps for 40 minutes at a current density of 50 amps/ft.[2] to a thickness of 1.64 mils. Plating was quite rapid, and the dumbell specimen was covered with copper within 5 minutes.

A plated dumbell of this type had a peel strength of 4.5 lbs./in., and exhibited a bright, mirror-like finish, with no voids or skips.

Other dumbells, after being plated with a 1.0 mil thick copper plate, were plated with 0.5 mil bright nickel by the Udylite No. 66 process, using 9.2 amps/15 minutes, 40 amps/ ft.[2], and then plated with a 0.01 mil bright chromium using the Udylite "Cromylite" K50 bath, 34 amps/1 min., 150 amps/ ft.[2]. These dumbells had a mirror-like finish and passed 3 wet thermal cycles and 3 thermal shock cycles described above.

Although proprietary products of various companies were used in the treating and electroplating steps described above, non-proprietary products could be used instead with similar results. The preetch penetrant "Proprep" D-40 and acid cleaner L-56 of MacDermid have been described generally above. Suitable electroplating techniques and chemicals including brighteners are known in the art such as described in "Metal Finishing for 1972, Guidebook Directory", published by Metals and Plastics Corp., Inc. of Westwood, New Jersey. Although proprietary baths can vary, certain relevant information is given below on commercial baths used to demonstrate the invention. Udylites's plating baths referred to above contain and are operated as follows:

| | |
|---|---|
| "UBAC" #1 bright acid copper | |
| $CuSO_4$ | 30 oz./gal. |
| $H_2SO_4$ | 7.5 oz./gal. |
| HCl | 0.3 cc/gal. |
| proprietary brightener | 0.5% |
| cathode current density | 50 amps/ft.[2] |
| temperature | 21° C. |
| Udylite #66 bright acid nickel | |
| $NiSO_4 . 6H_2O$ | 45 oz./gal. |
| $NiCl_2 . 6H_2O$ | 10 oz./gal. |
| $H_3BO_3$ | 6.3 oz./gal. |
| proprietary brightener | 2% |
| cathode curent density | 60 amps/ft.[2] |
| anode current density | 40 amps/ft.[2] |
| temperature | 60° C. |

-continued

| | |
|---|---|
| pH | 4.0 |
| "Chromylite" K 50 bright acid chromium | |
| CrO$_3$ | 43 oz./gal. |
| sulfate | 0.27 oz./gal. |
| proprietary brightener | (included in above) |
| cathode current density | 150 amps/ft.$^2$ |
| temperature | 46° C. |

Other electroplating systems used in the study of this invention use the following baths:

| | |
|---|---|
| Watts nickel | |
| NiSO$_4$ . 6H$_2$O | 44 oz./gal. |
| NiCl$_2$ | 6 oz./gal. |
| H$_3$BO$_3$ | 5 oz./gal. |
| temperature | 60° C. |
| pH | 3.5 |
| "Econochrome" bright chromium (Du Pont) | |
| CrO$_3$ | 40 oz./gal. |
| sulfate | 0.25 oz./gal. |
| proprietary brightener | (included in above) |
| cathode current density | 100 to 200 amps/ft.$^2$ |
| temperature | 65° C. |

EXAMPLE 2

50 PP/30 C/10 EPDM/10 PE

This example was run like Example 1, but substituting an etchant bath composed of 13 percent CrO$_3$, 40 percent H$_2$SO$_4$ and 47 percent H$_2$O. This bath was run at 50° C. for 2 minutes, followed by rinsing with a 5 percent NaOH solution using ultrasonic agitation. Appearance was good, with a peel strength of 5.5 lbs./in. at a plate thickness of 1.7 mils.

On the other hand, the general CrO$_3$-H$_2$SO$_4$ type etchant composition is necessary. Thus, substitution for the above etchants of a concentrated H$_2$SO$_4$ dip, or a concentrated NaOH dip led to no plating. was good, with a peel strength of 5.5 lbs./in. at a plate thickness of 1.7 mils.

On the other hand, the general CrO$_3$-H$_2$SO$_4$ type etchant composition is necessary. Thus, substitution for the above etchants of a concentrated H$_2$SO$_4$ dip, or a concentrated NaOH dip led to no plating. cl EXAMPLE 3

42.5 PP/32.5 C/12.5 EPDM/12.5 PE

This shows that certain compositions containing a linear polyethylene homopolymer rather than a crystalline ethylene/α-olefin copolymer can also lead to good results, but they require higher temperature etchant conditions than the composition used in Example 1.

A composition was prepared by dry blending 42.5 percent Type B polypropylene, 32.5 percent carbon black, 12.5 percent EPDM elastomer, and 12.5 percent Type D polyethylene. The mix was then extruded through a 28 mm. Werner and Pfleiderer twin screw extruder, chopped and injection molded as in Example 1. Physical properties were tensile yield stress 3620, tensile to break 3620 psi; 1 percent flex modulus 227,000 psi, tensile elongation at break 5 percent, notched Izod impact 4.6 ft. lbs./in., HDT 60° C., volume resistivity 2.2 ohm-cm.

Bars were plated using the "Proprep" D-40 swellant at 73°/7 min., rinsed, dipped in acid cleaner L-56 at 57°/2 min., etched in L-43 etchant at 82°/5 min., rinsed, given a 30 percent NaOH solution dip at 68° C./5 min., rinsed, and then copper plated with "UBAC" No. 1 copper plating system as in Example 1. The bars had an excellent mirror-like finish, a peel strength of 6.5 lbs./in. and passed the thermal cycle and shock tests.

Milder etching conditions gave less satisfactory results.

EXAMPLE 4

50 PP/30 C/10 rubber/10 PE

This shows that other rubbers besides EPDM elastomers can be used.

A. A blend of 50 percent Type R polypropylene, 30 percent carbon black, 10 percent "Kraton" 1101, and 10 percent Type B polyethylene was extruded and injection molded. "Kraton" 1101 is an unvulcanized 25/75 styrene/butadiene block copolymer sold by the Shell Chemical Company. In the injection-molded condition, volume resistivity was 4.8 ohm-cms, tensile yield 4340 psi, tensile strength at break 4340 psi, 1 percent secant flex modulus 286,000 psi, tensile elongation at break 4.6%, notched Izod impact 0.8 ft. lbs./in., and HDT of 69° C. Using the etchant system of Example 2, fast plating with good appearance, and peel strength of 7 lbs./in. were obtained.

B. A similar blend was made with "Vistanex" L-80 polyisobutylene from Exxon Chemical Corporation of Houston, Texas, as the rubber.

Bars with good physical properties were obtained, and they plated readily. Appearance was good and adhesion fair.

EXAMPLE 5

47.5 PP/32.5 C/10 EPDM/10 PE

This shows that a pre-swellant treatment such as used in Example 1, although sometimes desirable, is not necessary for good results.

Flat plaques having a composition of 47.5% Type B polypropylene, 32.5 percent carbon black, 10 percent EPDM elastomer, and 10 percent Type D polyethylene were blended, extruded and molded using the methods of Example 1. The plaque was dipped in MacDermid L-56 acid cleaner, then into the etchant of Example 2 at 50° for 5 min., rinsed in water at 29° C. for 3 min., then treated in a 30 percent NaOH bath at 66° C for 5 min., rinsed and then electroplated in a "UBAC" No. 1 copper plating bath as in Example 1. Plating proceeded rapidly to give a satisfactory plate of good appearance with a peel strength of 5 lbs./in.

EXAMPLE 6

50 PP/30 C/10 EPDM/10 PE

Injection molded articles of Example 1 were pretreated and electroplated by a preferred sequence of steps.

The articles were rinsed in acid cleaner L-56 at 57° C. for 1.5 to 2 minutes and allowed to drain.

They were then etched at 50 to 55° C. for 5 to 10 minutes in an etch of 13 percent CrO$_3$, 40 percent H$_2$SO$_4$, 46.9 percent H$_2$O and 0.1 percent benzene disulfonic acid, followed by a water rinse at 30° C. for 3 minutes.

The articles were then rinsed in a stirred 30 percent NaOH-water bath at 67° C. for 5 minutes, followed by a water rinse at 30° C. for 2 minutes.

Optionally, but for better results, the articles could then be rinsed in a bath having the same composition as the electroplating bath to follow for a few minutes at room temperature (about 23° C).

The first electroplating step is preferably a thin strike of nickel. A watts nickel bath or a commercial bright nickel bath can be used for about 6 minutes or long enough to lay down a thin nickel layer about 0.1 mils thick. The articles are then rinsed in water and treated with 10 percent $H_2SO_4$ in water at room temperature for 10 to 20 seconds. Then a commercial copper bath such as UBAC No. 1 is used at room temperature for long enough to obtain the desired thickness of copper, such as 0.6 to 1 to 2 mils. About 1 mil is a satisfactory copper thickness for outdoor use of the product after the other metal plates have been applied.

Next a layer of bright nickel is applied to a thickness 0.3 to 0.6 mils, and the articles are rinsed again in a 10 percent $H_2SO_4$ solution in water for 20 seconds.

Finally, about 0.01 mil of chromium is applied.

Conventional electroplating techniques can be used in all cases. For outdoor use in rigorous environments, known approaches include using deplex layers of dull and bright nickel and using a microcracked chromium layer.

Several different blends of the invention were subjected to three different preferred preplate sequences and then were electroplated as described above. The plating results are presented in Tables V, VI and VII below. The "speed" indicated is the time required for 100 percent coverage of the sample by the electroplates.

Except where indicated otherwise, the composition percentages are, in this order, Type B polypropylene, carbon black, EPDM elastomer, and Type C polyethylene.

The preplate treatments are of the types described above and are specified at the head of each table. The composite electroplate was the above-described Cu-/Ni/Cr plate without the initial Ni strike. In the rinse in Table VII, the surfactant used was Du Pont's TLF 3141 at a concentration of 0.05 percent, and the chelating agent was the sodium salt of ethylene diamine tetraacetic acid used at a concentration of 0.02 percent.

TABLE V

"Proprep" D-40 (73° C./2 min.)
L-56 Acid Cleaner (56° C./2 min.)
$CrO_3$-$H_2SO_4$ Etchant[a] (82° C./5 min.)
5% NaOH + Ultrasonic Rinse (68° C./5 min.)

| Sample | Composition | Speed (min.) | Appearance | Thickness (mils) | Peel (lbs./in.) |
|---|---|---|---|---|---|
| 1 | 52.5/32.5/5/10 | 5–10 | fair-good | 1.0–1.5 | 7.5–9.5 |
| 2 | 55/32.5/7.5/5 | <5 | fair | 0.8–1.1 | 2.5–72.0 |
| 3 | 47.5/32.5/10/10[b] | 5–10 | good | 0.9–1.2 | 5–6 |
| 4 | 50/30/5/15 | 5–15 | fair | 0.7–0.9 | 5.5–6 |
| 5 | 50/30/10/10 | <5 | fair | 1.0–1.5 | 6–9 |
| 6 | 50/30/10/10 | <5 | fair | 0.9–1.0 | 4.5–7 |

[a]Etchant was 13% $CrO_3$; 40% $H_2SO_4$; 47% $H_2O$.
[b]Used Type A polyethylene.

TABLE VI

"Proprep" D-40 (72° C./7 min.)
L-56 Acid Cleaner (58° C./2 min.)
$CrO_3$-$H_2SO_4$ Etchant[a] (50° C./2 min.)
5% NaOH + Ultrasonic Rinse (68° C./5 min.)

| Sample | Composition | Speed (min.) | Appearance | Thickness (mils) | Peel (lbs./in.) |
|---|---|---|---|---|---|
| 7 | 52.5/32.5/5/10 | 15–20 | fair-good | 1.1–70.8 | 2.5–3.0 |
| 8 | 55/32.5/7.5/5 | 10–20 | fair | 0.8–1.1 | (could not start) |
| 9 | 47.5/32.5/10/10 | <5 | good-excellent | 0.9–1.2 | 2.5–4.5 |
| 10 | 47.5/32.5/10/10 | 15–20 | good-fair | 1.0–1.5 | 5.0 |
| 11 | 50/30/5/15 | 15–20 | good | 1.0–1.4 | 3.5–5 |
| 12 | 50/30/10/10 | 15–20 | good | 1.1–1.7 | 4.0–5.5 |

[a]Etchant was 13% $CrO_3$; 40% $H_2SO_4$; 47% $H_2O$.

TABLE VII

"Proprep" D-40 (72° C./7 min.)
L-56 Acid Cleaner (58° C./2 min.)
$H_3PO_4$ Etchant[a] (48° C./5 min.)
37% HCl + Surfactant + Chelating Agent +
Ultrasonic Rinse (28° C./5 min.)

| Sample | Composition | Speed (min.) | Appearance | Thickness (mils) | Peel (lbs./in.) |
|---|---|---|---|---|---|
| 13 | 52.5/32.5/5/10 | 15–20 | good | 0.9–1.9 | 6–7 |
| 14 | 47.5/32.5/10/10 | >20 | fair | 0.9–1.3 | 7–8 |
| 15 | 50/30/5/15 | >20 | fair | 0.9–1.3 | 8–9 |
| 16 | 50/30/10/10 | 5–10 | good | 1.0–1.4 | 7–8 |

[a]Etchant was 67% $H_3PO_4$, 16% $H_2SO_4$, 12% $H_2O$, 3% $CrO_3$, 2% $K_2Cr_2O_7$.

From these data and others, the composition ranges of the invention in approximate weight percentages have been determined.

Over 45 percent carbon black gives a blend too difficult to extrude and too rough a surface for practical purposes. In the absence of mineral additives, under 26% carbon black gives a relatively low conductivity and resulting loss of ease in plating.

Under 1 percent rubber gives inadequate impact strength, over 15 percent rubber gives too soft a blend with inadequate stiffness and heat deflection temperature and sluggish plating characteristics.

Under 4 percent polyethylene gives too low plate adherence and speed. As the polyethylene content rises, the rubber should decrease (with a given amount of carbon black) to maintain adequate stiffness, and the desired stiffness requires no more than 20 percent polyethylene. Too high a polyethylene content also lowers plate adherence.

As the carbon black content rises, less polypropylene and more rubber and polyethylene should be used to maintain the desired flexibility and impact strength. With the softer propylene compolymers, the effect is less pronounced. More than 69 percent polypropylene would make too stiff a blend, and a blend with less than 20 percent would not have the needed stiffness modulus of elasticity or heat deflection temperature.

EXAMPLE 7

47.5 PP/32.5 C/10 EPDM/13 LDPE

Low density polyethylene can be substituted for high density polyethylene if it is treated properly.

Results of tests performed with this material are presented in Table V for Sample 3.

EXAMPLE 8

This illustrates that substitution of certain mineral additives for the polymer components in polypropylene/carbon black/EPDM rubber/ethylene copolymer compositions increases the conductivity.

A dry rolled blend was prepared of the following: polypropylene Type B, "Vulcan" XC-72 carbon black, No. 1731 "Micro Talc", granular EPDM elastomer, Type D polyethylene. The blends were then extruded in a 28 mm Werner & Pfleiderer twin screw machine, then molded into rtest bars in a 1½ oz. Aruburg reciprocating screw injection molder. In some of these compositions the mineral additive was omitted for control purposes. Also in some cases Type B polyethylene homopolymer was used instead of the Type D ethylene copolymer. Composition vs. electrical resistivity measurements are present in Table VIII.

In Sample 18, the talc was added at the expense of the polypropylene, and the resistivity dropped. In Sample 19, the talc was added at the expense of all the polymeric materials present in the control, Sample 16, and the resistivity again is reduced compared to the control. In Samples 20, 21 and 22, addition of small amounts of surface modifier and crosslinking agent further reduced the resistivity. In addition to the constituents shown in the table, Sample 20 also contained 0.4% A 1100 silane, and 0.2% dicumyl peroxide, and Samples 21 and 22 both contained 0.3% A 174 silane and 0.6% dicumyl peroxide.

TABLE VIII

Effect of Mineral Additive on Electrical Resistivity

| Sample No. | PP | C | Talc | EPDM | PE | Electrical Resistivity (ohm-cm) |
|---|---|---|---|---|---|---|
| 16 | 50 | 30 | — | 10 | 10 Type D | 3.0 |
| 17 | 50 | 30 | — | 10 | 10 Type B | 4.2 |
| 18 | 35 | 30 | 15 | 10 | 10 | 2.0 |
| 19 | 39 | 30 | 15 | 8 | 8 | 1.3 |
| 20 | 35 | 33 | 15 | 10 | 10 | 1.5 |
| 21 | 44 | 24 | 15 | 8 | 8 | 11.8 |
| 22 | 39 | 24 | 21 | 8 | 8 | 5.7 |

EXAMPLE 9

44 PP/24 C/15 Talc/8 EPDM/8 PE

This is a demonstration of satisfactory performance with lower levels of high structure carbon black and high levels of mineral additive. See Sample 24 in Table IX.

A dry blend sample was prepared by rolling as before, 45% Type C polypropylene, 24% "Vulcan" XC-72 carbon black, 15% "Micro-Talc" No. 1731, 8% EPDM rubber pellets, 8% Type D ethylene copolymer, 0.3% carbide's A174 silane, and 0.6% dicumyl peroxide (Lupersol 500R of Pennwalt Chemical Co.). The blend was then extruded and molded into bars as in Example 8. Table IX shows the properties of these bars, plated and unplated. The electrical resistivity is higher on addition of the talc than with previous blends described in Example 8 which had 30% carbon black, but the resistivity is still well within the range (20 ohm-cm) required for fast electroplateability and good adhesion. Impact strength is also lower but quite acceptable. Note the improvements in heat deflection temperature, stiffness, tensile strength, shrinkage, and adhesion or peel strength of the resulting plate.

Note that appearance of sample 24 and 25 is excellent despite the added filler content. shrinkage, although greater than with ABS, is considerably less than the control, sample 23, without talc, or straight polypropylene. Similar results were obtained with "Cabolite" P-4 wollastonite as the mineral additive.

EXAMPLE 10

39 PP/24 C/21 Talc/8 EPDM/8 PE

This demonstrates good performance with a lower level of high structure carbon black, and with higher talc (21% of total). This is Sample 25 in Table IX. It also contained 0.3% silane and 0.6% dicumyl peroxide.

This blend was prepared as in Example 9. Note the higher talc level has led to lower resistivity and lower shrinkage than Example 9, and with still higher stiffness, tensile strength, percent elongation to break, and lower mold shrinkage. The electroplate had excellent appearance, good peel strength, and excellent thermal cycle performance.

The mold shrinkage values in this case is approaching that of ABS, which would permit direct usage of such molds in most cases. Note also the superior thermal cycle performance of these compositions compared to a standard plating grade ABS.

EXAMPLE 11

39 PP/17 C/28 Talc/8 PEDM/8 PE

This demonstrates good performance with still lower levels of high structure carbon black, and still higher levels of talc. This is Sample 28 in Table IX. It too contained 0.3% silane and 0.6% dicumyl peroxide.

The blend was prepared as in Example 9 and 10. Electrical resistivity is only slightly higher than Sample 25 despite a drop of 7% in carbon black concentration, because of the effect of the mineral additive on conductivity, and is still within the range allowing good plateability. Note the excellent values for the heat distortion temperature and the flex modulus, the plate appearance and adhesion. Plating rate was not appreciably lower than in the other cases.

Sample 26 shows that too low a content of carbon black, 9%, prevents direct electroplating, giving a resistivity over 1 million ohm-cm, approaching infinity. Comparisons can be made with the ABS of Sample 27, plated by standard ABS techniques. Also, Sample 29 illustrates the use of less talc, a different silane, A 1100 from Union Carbide rather than the A 174 used with the other samples, and it had no peroxide. This blend gave a somewhat higher heat distortion temperature, tensile strength and notched Izod impact strength, but lower stiffness and elongation. Plate appearance was excellent and peel strength was good to excellent.

TABLE IX

Variations in Amounts of XC 72 and Talc

Notched HDT ° C.

TABLE IX-continued

| Sample No. | PP$_{(Type)}$ | C | Talc | EPDM | PE$_{(Type)}$ | Silane | Peroxide | Resistivity | Izod Impact | at 66 psi |
|---|---|---|---|---|---|---|---|---|---|---|
| 23 | 50$_{(B)}$ | 30 | — | 10 | 10$_{(C)}$ | — | — | 4.2 | 4.1 | 84 |
| 24 | 44$_{(C)}$ | 24 | 15 | 8 | 8$_{(D)}$ | 0.3 | 0.6 | 11.4 | 2.5 | 99 |
| 25 | 39$_{(C)}$ | 24 | 21 | 8 | 8$_{(D)}$ | 0.3 | 0.6 | 5.3 | 2.4 | 100 |
| 26 | 39$_{(C)}$ | 9 | 36 | 8 | 8$_{(D)}$ | 0.3 | 0.6 | Infin. | 1.8 | 106 |
| 27 | — | — | — | — | — | — | — | Infin. | 3.5 | 82 |
| 28 | 39$_{(C)}$ | 17 | 28 | 8 | 8$_{(D)}$ | 0.3 | 0.6 | 13.5 | 2.4 | 107 |
| 29 | 44$_{(A)}$ | 24 | 15 | 8.5 | 8.5$_{(D)}$ | 0.2 | — | 5.8 | 2.9 | 108 |

| Sample No. | Flex. Mod. (1% Secant) | Max. Tensile (psi) | % Elong. to Break | Mold Shrinkage | Appearance | Peel Strength (lb/in) | Thermal Cycle | Thermal Shock |
|---|---|---|---|---|---|---|---|---|
| 23 | 223,000 | 3,400 | 3.2 | 1.4 | Exc. | 4.5 | Exc.-3~ | exc.-3~ |
| 24 | 251,000 | 3,670 | 3.2 | 0.92 | Exc. | 12 | Exc.-2½~ | — |
| 25 | 351,000 | 4,010 | 4.5 | 0.73 | Exc. | 8 | Exc.-3~ | — |
| 26 | 297,000 | 3,870 | 5.8 | 0.74 | Zero Plate | — | — | — |
| 27 | 327,000 | 6,320 | 5.0 | 0.60 | Exc. | 5-7 | 75% Failed on 2~ | All Failed on 1~ |
| 28 | 317,000 | 4,020 | 5.1 | 0.80 | — | 10 | — | — |
| 29 | 268,000 | 4,150 | 3.1 | — | — | 10 | — | — |

EXAMPLE 12

50 PP/30 C/10 EPDM/10 PE with Variations

The samples in Table X show the excellent results possible using blends with the lower cost carbon blacks. The various carbon blacks are identified in Table II.

In the blends of this example, the combined total carbon black content has been kept in the 26 to 32% level. Note that control Sample 30 is the same as Sample 23 in Table IX.

The results are assemblied in Table X. They show that if the mineral additive is present, using mixtures of "Vulcan" XC-72 with the low cost "Vulcan" 6 at even lower overall concentrations of carbon black than the control gave lower electrical resistivities than the control, compare Sample 31 and 32 with Sample 30. In addition, heat distortion temperatures, stiffness, tensile strength and mold shrinkage levels were all much better than the control. Impact strength was lowered, but is still at an acceptable level. The plated parts exhibited excellent or good to excellent appearance, adhesion and resistance to the thermal cycle test, and peel strength was significantly higher than the control. Also shown in Table X are similarly excellent results with use of other carbon blacks. "Regal" 660 and "Vulcan" C, in combination with "Vulcan" XC-72 gave low resistivity, high heat distortion temperature, flex moduli and tensile strength, and high properties of the plated parts.

TABLE X

Compositions With Different Blends of Carbon Black

| Sample No. | PP | Carbon Black "Vulcan" XC-72 | Other Black | Talc | EPDM | PE | Silane | Peroxide |
|---|---|---|---|---|---|---|---|---|
| 30 | 50 | 30 | 0 | 0 | 10 | 10 | 0 | 0 |
| 31 | 39 | 20 | 6 "Vulcan" 6 | 19 | 8 | 8 | 0.2 | 0.4 |
| 32 | 39 | 16 | 12 "Vulcan" 6 | 17 | 8 | 8 | 0.2 | 0.4 |
| 33 | 39 | 20 | 8 "Regal" 660 | 17 | 8 | 8 | 0.2 | 0.4 |
| 34 | 39 | 16 | 16 "Regal" 660 | 13 | 8 | 8 | 0.2 | 0.4 |
| 35 | 39 | 20 | 6 "Vulcan" 6 | 19 | 8 | 8 | 0.2 | 0.4 |
| 36 | 39 | 16 | 12 "Vulcan" 6 | 17 | 8 | 8 | 0.2 | 0.4 |

| Sample No. | Resistivity | Notched Izod Impact | HDT (° C at) 66 psi | Flex Mod. (1% Secant) | Max. Tensile psi | % Elong. to Break | Mold Shrinkage (%) | Peel Strength (lb/in) |
|---|---|---|---|---|---|---|---|---|
| 30 | 4.2 | 4.1 | 84 | 223,000 | 3400 | 3.2 | 1.4 | 4.5 |
| 31 | 3.6 | 1.7 | 107 | 322,000 | 4000 | 3.0 | 0.9 | 11 |
| 32 | 3.7 | 1.9 | 103 | 322,000 | 4020 | 3.2 | 0.9 | >16 |
| 33 | 3.8 | 1.4 | 103 | 320,000 | 4020 | 3.3 | — | >16 |
| 34 | 5.7 | 1.2 | 95 | 307,000 | 3800 | 3.2 | — | >16 |
| 35 | 3.7 | 1.7 | 100 | 319,000 | 4000 | 3.0 | — | >16 |
| 36 | 4.0 | 1.8 | 102 | 323,000 | 3890 | 2.8 | — | >16 |

EXAMPLE 13

This example illustrates the good results obtainable on blending high structure carbon black with the lower structure, lower cost blacks, and at the same time reducing the total carbon black content. This will minimize costs, as the mineral additives are appreciably cheaper than the carbon blacks.

In Table XI are the results obtained when the ratio of high structure/low structure carbon black is 9/11, the total concentration of carbon blacks 20% and talc 25% in Sample 38, as compared to the case when the carbon black ratio is 16/12, the total black is 28% and the talc 17% is Sample 37.

We see that for Sample 28 with total mixed carbon black content of 20%, talc content 25%, the resistivity of 12.1 ohm-cm is practically as low as for the case for Sample 24 (Table IX) with 24% "Vulcan" XC-72, zero percent low structure black, and 15% talc or as low as the case with 17% "vulcan" XC-72, zero low structure black, and 28% talc, sample 28 in Table IX. It is true that the resistivity of Sample 38 is higher than for Sample 37, the case when the high structure/low structure ratio of carbon blacks is higher at 16/12, the total carbon black content is higher at 28%, and the talc content lower at 17%. However, the resistivity of Sample 38 is well within the range required for rapid plating and high appearance and adhesion values. Note also the excellent physical properties of the molded, unplated bars, with high modulus, and increased heat distortion temperature, elongation to break, and total energy to break, measured by the area under the stress-strain curve and related to toughness.

A statistical systematic study was made relating concentrations of 37 Vulcan" XC-72, "vulcan" 6 and talc to changes in physical properties and cost. Apparently, good properties at minimal cost can still be obtained with "Vulcan" XC-72 as low as about 5%, "Vulcan" 6 about 20 to 25%, and talc about 20 to 25%. Notched Izod impact, plate appearance, and conductivity appear to be the limiting factors at still lower levels of high structure carbon black.

TABLE XI

Variations in Amounts of Carbon Black and Mineral Additive

|  | Sample 37 | Sample 38 |
|---|---|---|
| Composition |  |  |
| PP (Type C) | 39 | 39 |
| "Vulcan" XC-72 | 16 | 9 |
| "Vulcan" 6 | 12 | 11 |
| Talc | 17 | 25 |
| EPDM | 8 | 8 |
| PE (Type D) | 8 | 8 |
| A 174 Silane | 0.3 | 0.3 |
| Lupersol 500R | 0.6 | 0.6 |
| Plastic Properties |  |  |
| Resistivity (ohm-cm) | 3.7 | 12.1 |
| % Shrinkage | 0.91 | 0.81 |
| Notched Izod Impact (ft./lb/in.) | 1.9 | 2.1 |
| HDT (° C. at 66 psi) | 103 | 108 |
| Flex Modulus (1% Secant) (psi) | 322,000 | 324,000 |
| Max. Tensile (psi) | 4,020 | 4,120 |
| Elongation to Break (%) | 3.2 | 5.3 |
| Total Energy to Break (in-lb) | 24 | 38 |
| Plate Properties |  |  |
| Appearance | Exc.-Good | Exc. |
| Peel Strength (lb/in) | 14 | 12 |
| Thermal Cycle Performance | Exc. | — |

EXAMPLE 14

40 PP (E)/30 XC-72/15 Micro Talc 1731/5 EPDM/10 PE (D) 0.2A 1100 Silane

This example shows the excellent properties obtained if a propylene - block copolymer rather than a propylene homopolymer is used as the main polymer component. High impact and good heat distortion temperature are obtained with very low levels of incorporated rubber.

This composition was prepared as above by dry blending, extrusion, and injection molding to test bars and plaques. Physical properties of the bars were:
  Electrical resistivity 3.1 ohm-cm
  Heat deflection temp at 71 psi 102° C.
  Notched Izod impact (ft. lbs/in) 4.3
  Flex modulus (1% secant) 259,000 psi
  Max tensile strength 3340 psi
  Percent elongation to break 5.2.
  Plating was carried out as in Example 9. Excellent appearance and thermal cycle performance was shown.

If the blend is prepared without any EPDM rubber present, the notched Izod impact strength drops to 1.2 ft/lbs in notch, elongation to break down to 3%, and toughness of the bar is greatly reduced.

Comparative Test 1

This test shows that substitution of a polar ethylene copolymer, such as an ethylene/methacrylic acid copolymer, for the linear polyethylene or ethylene/α-olefin copolymer is unsatisfactory.

A composition was prepared in a Banbury mill containing 55 percent Type B polypropylene, 30 percent carbon black, 5 percent EPDM elastomer, and 10 percent of an 85/15 ethylene/ methacrylic acid copolymer, having a flow rate of 17. The blend was then injected molded to form test bars. Certain properties were satisfactory. The tensile strength at yield was 4230 psi, tensile at break 4170 psi, elongation at break 5 to 7 percent, flex modulus (1 percent secant) 265,000 psi, notched Izod impact 1.5 ft. lbs./in., HDT (264 psi) 57° C. However, the electrical resistivity was high, 90,000 ohm-cms, and no plating resulted using etch baths described in Examples 1 and 2. A considerably higher level of carbon would be required to develop adequate conductivity, which would make blending and molding difficult, and lower the impact strength. Addition of more rubber could help the latter property, but then the HDT would become too low.

Comparative Test 2

For purposes of comparison, control specimens of ABS bars were molded and plated to the same thicknesses as in Example 1 and were plated using commercial electroless preplating systems such as the MacDermid "Macuplex" RT system. They had attractive appearance but severely failed the vigorous thermal shock test, with serious cracks and blisters. A filled nylon composite, which was also given a preplate cycle involving an etch, the Pd catalyst and an electroless nickel plate, also failed the thermal shock test. A 100 percent ABS or polypropylene bar, or a bar containing only non-conductive fillers, could not be electroplated under the conditions of this invention, since they were non-conductive.

A filled ABS composition, containing 30 percent carbon black and 5 percent EPDM elastomer molded fairly well and was conductive. It was treated with MacDermid's L-56 acid cleaner at 54° C. for 2 min. and L-55 etchant at 68° C. for 5 min. as recommended for ABS by MacDermid. The bar was then rinsed in an NaOH solution. The etched bar could be plated directly, but its appearance was poor, and the peel strength was very low, less than 0.5 lb./in.

Comparative Test 3

This test shows that other highly structured conductive carbon blacks can be used, but that the more poorly structured conductive carbon blacks are unsatisfactory in the absence of highly structured carbon blacks required in the invention.

The following formulations with different conductive carbon blacks were blended, injection molded, treated and plated as described in Example 2. Type B polypropylene was used throughout.

The results of three series of tests are presented in Table XII. Series I used the preferred 50/30/10/10 ratios. Series II used more carbon at 32.5 percent for greater conductivity. Series III shows the effects of increasing carbon to 40 percent.

TABLE XII

VARYING CARBON BLACKS

| Series | Composition (%) | C Black | Notched Izod Impact (ft.lbs./in.) | Volume Resistivity (ohm-cm) | Plated |
|---|---|---|---|---|---|
| I | 50 Polypropylene<br>30 Carbon black<br>10 EPDM elastomer<br>10 Type C polyethylene | "Vulcan" XC 72 | 7 | 10 | Yes |
|  |  | "Vulcan" SC | 3 | 500 | No |
|  |  | "Vulcan" C | 2 | 470 | No |
| II | 42.5 Polypropylene<br>32.5 Carbon black<br>12.5 EPDM elastomer<br>12.5 Type B polyethylene | "Vulcan" XC 72 | 7.5 | 2.2 | Rapidly |
|  |  | "Vulcan" SC | 0.7 | 8.0 | Slowly |
|  |  | "Vulcan" C | 0.4 | 18.0 | No |
|  |  | "United" N-296 | 9.5 | 63.0 | No |
| III | 40 Polypropylene<br>40 Carbon black<br>10 EPDM elastomer<br>10 Type B polyethylene | "Vulcan" XC 72 | (brittle) | 2 | Rapidly |
|  |  | "Vulcan" SC | (very brittle) | 1.5 | Rapidly |
|  |  | "Vulcan" C | (not extrudible) | — | — |

Comparative Test 4

47.5 PP/32.5C/O rubber/20 PE

This test shows that compositions without the rubber tend to be brittle. A blend of 47.5 percent Type B polypropylene, 32.5 percent carbon black, and 20 percent Type C polyethylene was extruded and injection molded as in Example 1. The unplated bars had a notched Izod impact strength of only 0.28 ft. lbs./in., whereas unblended Type B polypropylene had an impact value of 0.8.

Comparative Test 5

This test shows that the composition of the rinse bath after the etch is important to adhesion and surface quality.

a. A bar of the composition used in Example 1 was given the same pre-etch and etch procedure, but the 5 percent NaOH rinse bath at 66° C./5 min. was replaced with a rinse of 37 percent HCl, 0.05 percent Du Pont's TLF 3141 fluorosurfactant, and 0.02 percent of a chelating agent which was the sodium salt of ethylene diamine tetraacetic acid. Plating appearance was good to excellent, with a peel strength of 5.3 lbs./in. The use of ultrasonics in the rinse bath raised the peel strength to 8 lbs./in.

b. A bar was prepared and treated as in Example 1, but with the use of an acid dip (5 percent $H_2SO_4$ + 0.1 percent HCl) without surfactant instead of the NaOH dip. The plating was fast and the appearance was good, but peel strength was unacceptably low at 1 lb./in.

Comparative Test 6  65 PP/30 C/5 EPDM/0 PE

This test shows the inferiority of blends made without polyethylene.

A blend was made with 1.67 lbs. (65%) Type B polypropylene, 0.77 lbs. (30%) carbon black, and 0.13 lbs. (5%) EPDM elastomer by milling in a Banbury. The blend was then granulated and injection molded to impact and tensile test bars. The bars had acceptable physical properties; tensile strength at break 4080 psi, percent elongation to break 11 percent, flex modulus (1% secant) 322,000 psi, notched Izod impact 3.6 ft. lbs./in., heat deflection temperature 66° (264 psi), electrical volume resistivity 22 ohm-cms. However, on plating as in Example (1), the plating rate was extremely slow.

When such bars were given a pre-plate treatment as in Example (3), the plating rate was again fairly slow, and the appearance was rated only fair-poor.

Also, none of the plated specimens without polyethylene had a peel strength of greater than four pounds per inch of specimen width, and several had less.

Other variations were made in composition and treating conditions with blends not containing polyethylene, but the desired combinations of appearance, peel strength, heat deflection temperature, thermal shock and thermal cycle resistance, and other characteristics were not obtained. Thus, compositions of the invention require certain amounts of polyethylene in combination with the other component materials.

What is claimed is:

1. A process for electroplating a metal coating onto an article composed of a polyolefin blend comprising a. 20 to 60 weight percent of propylene homopolymer or copolymer with an α-olefin having less than 10 carbon atoms, having a crystallinity of at least about 25 percent, the propylene content of said copolymer being at least 92 molar percent, b. 4 to 20 weight percent of an ethylene homopolymer or copolymer with an α-olefin having less than 10 carbon atoms, having a crystallinity of at least about 25 percent, the ethylene content of said copolymer being at least 88 molar percent, c. 1 to 15 L weight percent of a low polarity rubber having a low enough polarity to result in the electrical volume resistivity of the blend being less than about 25 ohm-cm in the injection-molded condition, d. 12 to 45 weight percent carbon black, having an average particle size less than about 40 mµ, and a volatile content of less than about 3 weight percent, at least 15% of the total of said carbon black being a high conductivity black having a dibutyl phthalate oil absorbtion value of at least about 1.00 cc/gm, an iodine adsorption number greater than about 160 mg/g, and e. optionally up to 45 weight percent silicate mineral additive dispsersed in said blend, substantially all of said additive being of a size that will pass through a screen having 44 micron openings, and at least 60% of the particles being smaller than 10 microns in cross sectional dimension, provided that when said mineral additive is used, the combined amounts of mineral additive and carbon black are between 35 and 60% by weight of the blend, the process comprising
a. molding the composition into articles of desired shape,
b. surface treating the article with a strongly oxidizing solution comprising $CrO_3$, $H_2SO_4$ and $H_2O$,
c. rinsing the surface, and
d. electroplating the treated object.

2. A process according to claim 1 wherein the oxidizing solution comprises, by weight, about 10 to 18 percent $CrO_3$, 30 to 50 percent $H_2SO_4$, 32 to 62 percent $H_2O$ and 0.02 to 2 percent of an aromatic sulfonic acid.

3. A process according to claim 2 in which the aromatic sulfonic acid is benzene disulfonic acid.

4. A process according to claim 2 wherein the oxidizing solution consists essentially of, by weight, about 12 percent $CrO_3$, 39 percent $H_2SO_4$, 48 percent $H_2O$ and 0.1 percent benzene disulfonic acid.

5. A process according to claim 1 wherein the rinsing is done with a 1 to 40 weight percent solution of NaOH in water.

6. A process according to claim 1 wherein the oxidizing solution of step (b) also contains $H_3PO_4$.

7. A process according to claim 6 wherein the oxidizing solution comprises, by weight, about 1 to 14 percent $CrO_3$, 0.5 to 6 percent $K_2Cr_2O_7$, 25 to 85 percent $H_3PO_4$, 8 to 40 percent $H_2SO_4$, and 5 to 12 percent $H_2O$.

8. A process according to Claim 7 wherein the oxidizing solution comprises, by weight, about 2 to 4 percent $CrO_3$, 2 to 3 percent $K_2Cr_2O_7$, 60 to 80 percent $H_3PO_4$, 12 to 20 percent $H_2SO_4$ and 5 to 12 percent $H_2O$.

9. A process according to claim 1 wherein the rinsing is done in a bath having essentially the same composition as the first electroplating bath.

10. An electroplated made by the process of claim 1.

11. An electroplated article of Claim 10 which has a multiplicity of electroplated layers, one on another.

12. An electroplated article of claim 11 wherein the force required to separate the electroplate from the polyolefinic blend is at least about 5 pounds per inch of width.

13. An electroplated article of claim 10 wherein the electroplated layer in direct contact with the polyolefinic blend is nickel.

* * * * *

UNITED STATES PATENT OFFICE
CERTIFICATE OF CORRECTION

PATENT NO. : 4,038,042
DATED : JULY 26, 1977
INVENTOR(S) : ROBERT L. ADELMAN

It is certified that error appears in the above-identified patent and that said Letters Patent are hereby corrected as shown below:

Column 32, line 48, delete "L".

Column 34, line 12, after "electroplated" add -- article --.

Signed and Sealed this

Twenty-ninth Day of November 1977

[SEAL]

Attest:

RUTH C. MASON
Attesting Officer

LUTRELLE F. PARKER
Acting Commissioner of Patents and Trademarks